United States Patent
Lee et al.

(10) Patent No.: US 9,853,237 B2
(45) Date of Patent: Dec. 26, 2017

(54) CURVED DISPLAY APPARATUS

(71) Applicant: SAMSUNG DISPLAY CO., LTD., Yongin-si, Gyeonggi-do (KR)

(72) Inventors: Jongsoo Lee, Yongin-si (KR); Hunkyo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/261,788

(22) Filed: Sep. 9, 2016

(65) Prior Publication Data
US 2017/0077439 A1 Mar. 16, 2017

(30) Foreign Application Priority Data
Sep. 15, 2015 (KR) .................. 10-2015-0130612

(51) Int. Cl.
*H01L 51/50* (2006.01)
*H01L 51/52* (2006.01)
*H01L 51/00* (2006.01)
*H01L 27/32* (2006.01)

(52) U.S. Cl.
CPC ...... *H01L 51/5237* (2013.01); *H01L 51/0097* (2013.01); *H01L 51/524* (2013.01); *H01L 27/3244* (2013.01); *H01L 51/5275* (2013.01); *H01L 51/5284* (2013.01)

(58) Field of Classification Search
CPC ... H01L 51/50; H01L 51/5237; H01L 51/524; H01L 51/5275; H01L 51/5284; H01L 27/32
See application file for complete search history.

(56) References Cited

U.S. PATENT DOCUMENTS

| 2011/0233533 | A1 | 9/2011 | Jang et al. |
| 2014/0167010 | A1 | 6/2014 | Jung et al. |
| 2014/0376165 | A1 | 12/2014 | Han et al. |
| 2015/0090969 | A1* | 4/2015 | Han ................ H01L 51/524 |
| | | | 257/40 |

FOREIGN PATENT DOCUMENTS

| KR | 10-2006-0007270 A | 1/2006 |
| KR | 10-2010-0034075 A | 4/2010 |
| KR | 10-2014-0080677 A | 7/2014 |
| KR | 10-2014-0147925 A | 12/2014 |
| KR | 10-2014-0148176 A | 12/2014 |

* cited by examiner

*Primary Examiner* — Hoai V Pham
(74) *Attorney, Agent, or Firm* — Lewis Roca Rothgerber Christie LLP (57) ABSTRACT

A curved display apparatus includes a display panel having a curvature and including a display area, and a non-display area extending from at least one side of the display area, a cover window on the display panel, the cover window having a curvature and including a first region, and a second region extending from at least one side of the first region, and a functional film between the display panel and the cover window, the functional film including a first film portion corresponding to the first region, a second film portion corresponding to the second region, and an opening exposing the display area of the display panel.

20 Claims, 5 Drawing Sheets

CURVED DISPLAY APPARATUS

CROSS-REFERENCE TO RELATED APPLICATION

This application claims priority to and the benefit of Korean Patent Application No. 10-2015-0130612, filed on Sep. 15, 2015, in the Korean Intellectual Property Office, the disclosure of which is incorporated herein in its entirety by reference.

BACKGROUND

1. Field

One or more exemplary embodiments relate to a curved display apparatus.

2. Description of the Related Art

Generally, a display apparatus may be utilized in a mobile apparatus, such as a smart phone, a laptop computer, a digital camera, a camcorder, a portable information terminal, a notebook, and a tablet personal computer, and in an electronic apparatus, such as a desktop computer, a television, a billboard, and an exhibition display apparatus.

Recently, a flexible display device, which is portable and applicable to various types of electronic apparatuses, has attracted attention as a next generation display device. Among these apparatuses, a curved display device is bent at an edge of a display panel to display an image on both a front and a side of the curved display apparatus.

SUMMARY

One or more exemplary embodiments include a curved display device with few or no defects in a display area of the curved display device.

Additional aspects will be set forth in part in the description which follows and, in part, will be apparent from the description, or may be learned by practice of the presented embodiments.

According to one or more exemplary embodiments, a curved display apparatus includes a display panel having a curvature and including a display area, and a non-display area extending from at least one side of the display area, a cover window on the display panel, the cover window having a curvature and including a first region, and a second region extending from at least one side of the first region, and a functional film between the display panel and the cover window, the functional film including a first film portion corresponding to the first region, a second film portion corresponding to the second region, and an opening exposing the display area of the display panel.

According to one or more exemplary embodiments, the display area may correspond to the first region, and the opening may correspond to the display area.

According to one or more exemplary embodiments, the first region may have a substantially planar shape.

According to one or more exemplary embodiments, the first film portion may surround the opening.

According to one or more exemplary embodiments, the first film portion and the second film portion may be integrally formed.

According to one or more exemplary embodiments, the second region may be curved from the first region.

According to one or more exemplary embodiments, a size of the opening may be the same as a size of the display area.

According to one or more exemplary embodiments, the display area may include a first display area corresponding to the first region, and a second display area extending from at least one side of the first display area, and corresponding to the second region.

According to one or more exemplary embodiments, the first display area and the second display area may be continuous with each other and may be located on the display panel.

According to one or more exemplary embodiments, the opening may define a first opening corresponding to the first display area, and a second opening corresponding to the second display area.

According to one or more exemplary embodiments, the first opening and the second opening may be continuous.

According to one or more exemplary embodiments, the first film portion and the second film portion may be integrally formed and entirely surround the first opening and the second opening.

According to one or more exemplary embodiments, the functional film may include a substrate layer and a print layer between the substrate layer and the display panel.

According to one or more exemplary embodiments, the substrate layer may include at least one of polyethylene terephthalate (PET), polycarbonate (PC), polyimide (PI), polymethylmethacrylate (PMMA), polypropylene (PP), an acryl-based resin, and a silicone-based resin.

According to one or more exemplary embodiments, the print layer may include at least one of an organic pigment and an inorganic pigment.

According to one or more exemplary embodiments, the functional film may include a first adhesive layer between the substrate layer and the cover window.

According to one or more exemplary embodiments, the first adhesive layer may include at least one of an optical adhesive, an acryl adhesive, and a silicone adhesive.

According to one or more exemplary embodiments, the functional film may include a refractive layer.

According to one or more exemplary embodiments, the functional film may include an ultraviolet curing layer.

According to one or more exemplary embodiments, the display panel may include a display substrate, an organic light-emitting device on the display substrate and including a first electrode, a second electrode, and an organic emissive layer between the first electrode and the second electrode, and a thin film encapsulation film on the organic light-emitting device.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that although the terms "first", "second", etc. may be used herein to describe various components, these components should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present inventive concept.

Spatially relative terms, such as "upper" and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as being "above" other elements or features would then be oriented "below" the other elements or features. Thus, the example term "above" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on" or "connected to" another element or layer, it can be directly on or connected to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. As used herein, the terms "use," "using," and "used" may be considered synonymous with the terms "utilize," "utilizing," and "utilized," respectively. Also, the term "exemplary" is intended to refer to an example or illustration.

Herein, the use of the term "may," when describing embodiments of the present inventive concept, refers to "one or more embodiments of the present inventive concept." In addition, the use of alternative language, such as "or," when describing embodiments of the present inventive concept, refers to "one or more embodiments of the present inventive concept" for each corresponding item listed.

The electronic or electric devices and/or any other relevant devices or components according to embodiments of the present inventive concept described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
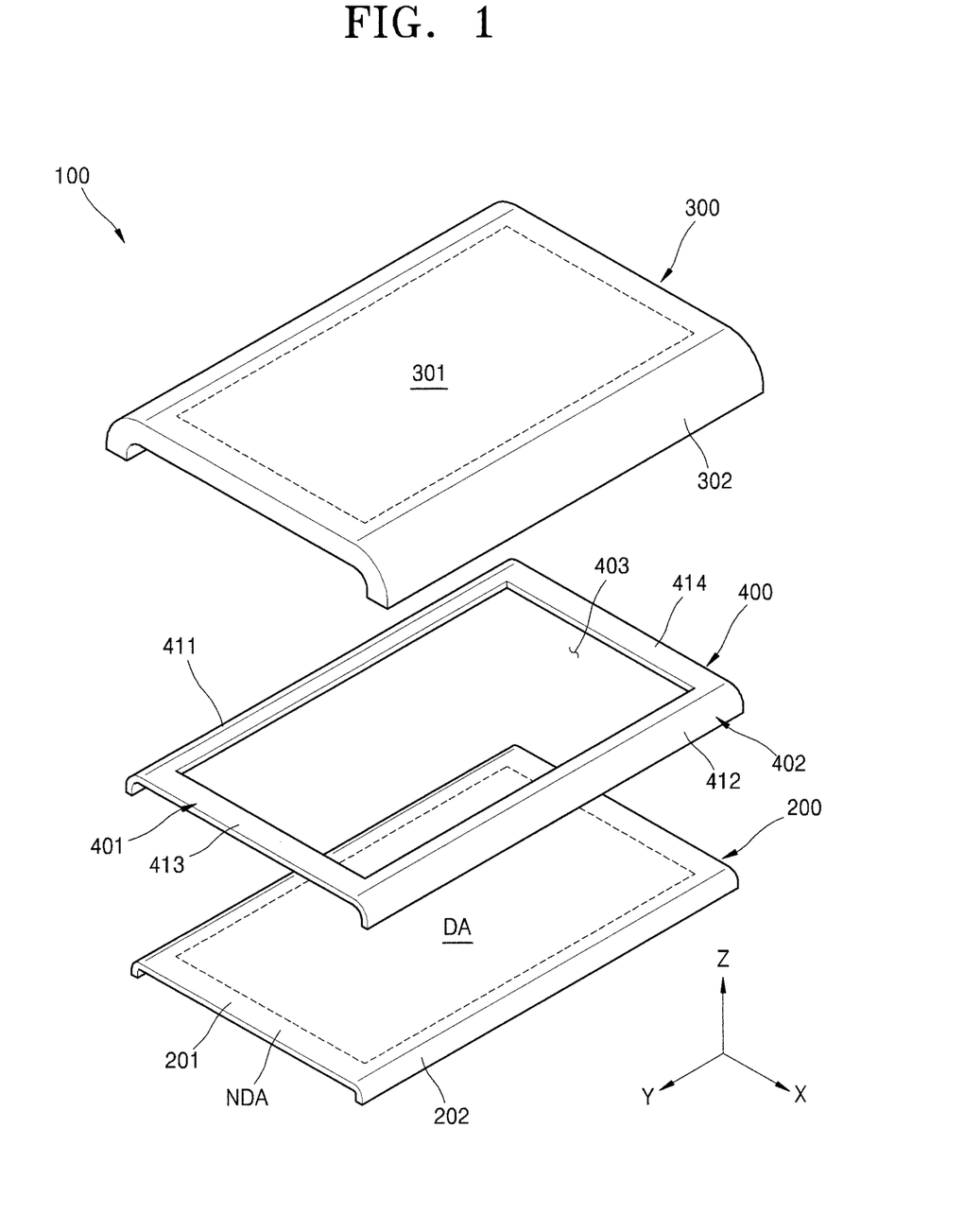
FIG. 1 is an exploded perspective view illustrating a curved display device according to one or more exemplary embodiments of the present inventive concept.
Figure 2:
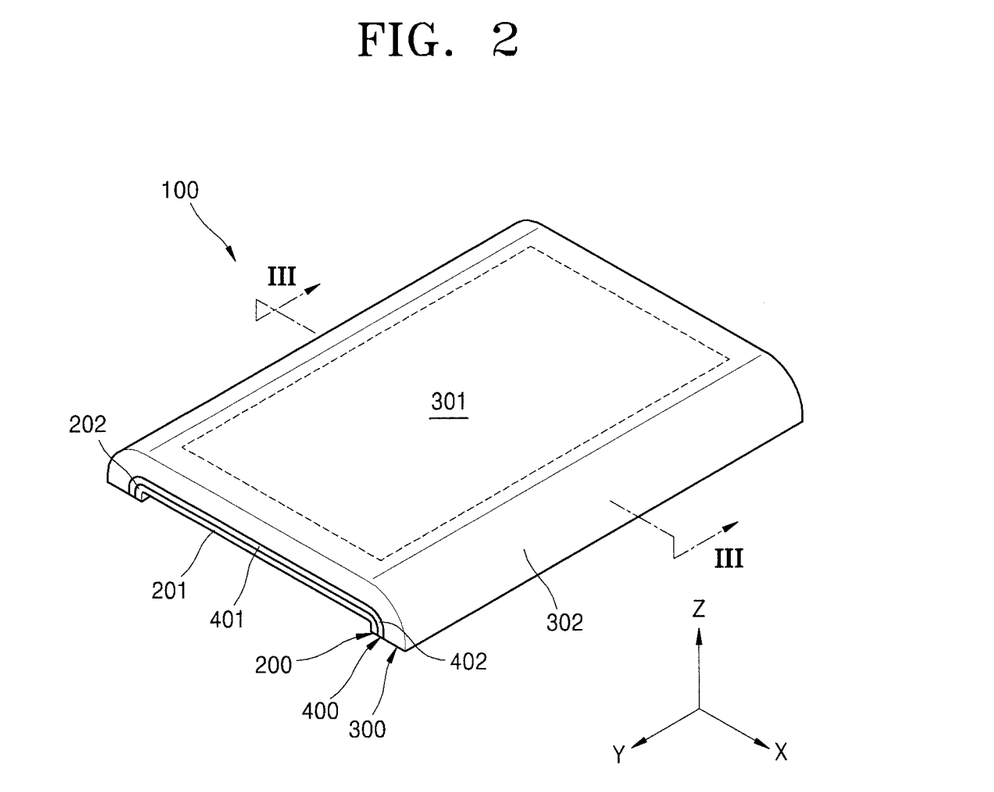
FIG. 2 is a perspective view illustrating the curved display device of FIG. 1.
Figure 3:
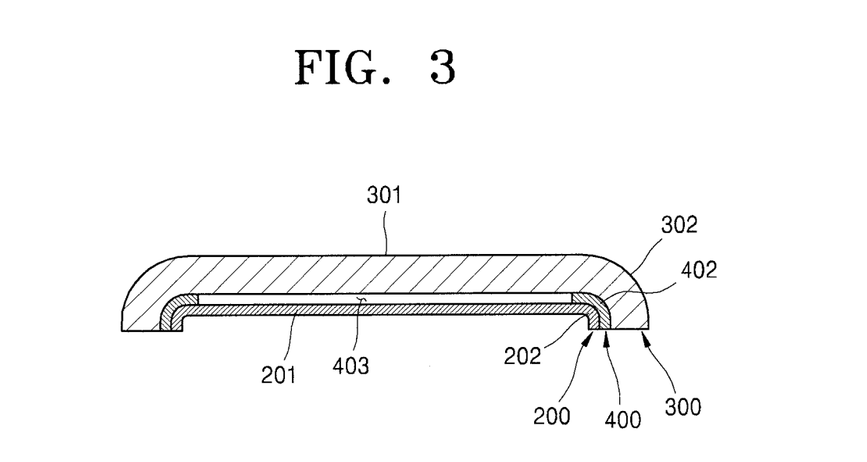
FIG. 3 is a cross-sectional view of the curved display device of FIG. 2 taken along the line of FIG. 2.

FIG. 1 is an exploded perspective view illustrating a curved display device 100 according to one or more exemplary embodiments of the present inventive concept, FIG. 2 is a perspective view illustrating the curved display device 100 of FIG. 1, and FIG. 3 is a cross-sectional view illustrating the curved display device 100 taken along the line of FIG. 2.

Referring to FIGS. 1 to 3, the curved display device 100 includes a display panel 200, a cover window 300 disposed on the display panel 200, and a functional film 400 disposed between the display panel 200 and the cover window 300.

The display panel 200 has flexibility (e.g., is flexible), and includes a flat portion 201 and a curved portion 202. In some embodiments, the display panel 200 may be bent at one or more sides.

The flat portion 201 may be disposed substantially parallel to a first plane (e.g., an X-Y plane) of the display panel 200. The curved portion 202 may be curved in a third direction (e.g., a Z direction) from the flat portion 201. The curved portion 202 and the flat portion 201 may be integrally formed. The curved portion 202 may be formed at one end of the display apparatus 100 or at both ends of the display apparatus 100. As long as the display panel 200 has a structure having a curvature at one or more ends, the present inventive concept is not limited to any particular example or embodiment.

The flat portion 201 may include a display area DA that is configured to display an image. The display area DA may include a light-emitting element for displaying the image of the display apparatus 100. A non-display area NDA may be disposed at one or more edges of the display area DA. The non-display area NDA may extend to one or more edges of the flat portion 201 from at least the one or more edges of the display area DA. The non-display area NDA may include various circuits to drive the display apparatus 100. The display area DA and the non-display area NDA may extend into the curved portion 202.

The cover window 300 may improve strength of the display apparatus 100 and may protect the display panel 200 from an external shock. The cover window 300 may maintain a curved shape of the display apparatus 100.

The cover window 300 may have light transmittance to transmit light from the display area DA. The cover window 300 may include various suitable materials. For example, the cover window 300 may be a glass window and/or a polymer window. According to some embodiments, the cover window 300 may include a material having at least a portion that is curved.

The cover window 300 includes a first region 301 having a substantially flat plane shape (e.g., a planar shape or a substantially planar shape) and a second region 302 extending from the first region 301 and including at least one window curved surface. The second region 302 may be curved from the first region 301 in the third direction (or the Z direction). The second region 302 may be disposed at opposite ends of the cover window 300.

The cover window 300 may be formed by a mold injection method. However, the present inventive concept is not limited thereto. For example, the second region 302 having window curved surfaces may be formed by bending the opposite ends of the window cover 300.

The first region 301 may be disposed to correspond to the display area DA. The first region 301 may cover the display area DA. A size of the first region 301 may correspond to the display area DA and at least a portion of the non-display area NDA that extends to an outside of the display area DA in the flat portion 201.

The functional film 400 may provide various functions to the display apparatus 100. For example, the functional film 400 may include a printing layer, a refractive layer, and/or an ultraviolet (UV) layer (e.g., a UV hardened layer or UV curing layer). In some exemplary embodiments, the functional film 400 may include a layer having another function.

The functional film 400 may have flexibility (e.g., the functional film 400 may be flexible). The functional film 400 may be attached to an inside of the window cover 300.

The functional film 400 includes a first film portion 401 and a second film portion 402 that extends from the first film portion 401. The first film portion 401 may be disposed to correspond to the first region 301 of the cover window 300. The second film portion 402 may be disposed to correspond to the second region 302 of the cover window 300. The first film portion 401 and the second film portion 402 may be formed as one body (e.g., may be formed integrally).

The first film portion 401 may define an opening 403. The opening 403 may be disposed to correspond to the display area DA. The display area DA may be exposed to the outside through the opening 403. A size of the display area DA may be the same or substantially the same as a size of the opening 403.

The first film portion 401 may surround the opening 403. In more detail, the first film portion 401 includes a first edge 411 and a second edge 412, which are disposed to face each other and extend along a second direction (e.g., a Y direction), and a third edge 413 and a fourth edge 414, which are disposed to face each other and extend along a first direction (e.g., an X direction). The first edge 411, the second edge 412, the third edge 413, and the fourth edge 414 may be adjacently connected to form a rectangular frame. In other words, the first edge 411 and the second edge 412 may both be connected to the third edge 413 and the fourth edge 414 to form a substantially rectangular frame.

However, if the functional film 400 has a structure which does not have a film at an area corresponding to the display area DA, the present inventive concept is not limited to a specific shape of the functional film 400. For example, when an entire area of the flat portion 201 is used as the display area DA, a film may be omitted on the flat portion 201 of the display panel 200.

According to a manufacturing method of the curved display apparatus 100, the functional film 400 may be attached to one side of the cover window 300, and then the cover window 300 may be combined with the display panel 200.

Figure 7:
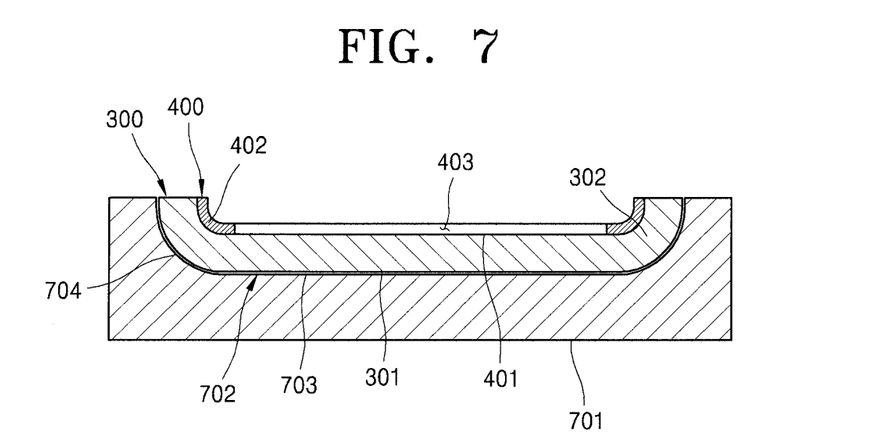
FIG. 7 is a cross-sectional view illustrating a functional film attached to a cover window of the curved display device of FIGS. 1.

In more detail, referring to FIG. 7, a stage 701 may be provided. The stage 701 includes a concave surface 702. The concave surface 702 may have a flat surface portion 703 and a curved surface portion 704 curved from the flat surface portion 703. The concave surface 702 may have a curvature that is substantially the same as a curvature of the cover window 300.

The cover window 300 is disposed on the concave surface 702. The functional film 400 may be attached to the cover window 300. The first film portion 401 may be attached to the first region 301 of the cover window 300, and the second film portion 402, which extends from the first film portion 401, may be attached to the second region 302 of the cover window 300.

Before the functional film 400 is attached to one side of the cover window 300, the opening 403 may be formed (or defined) in the first film portion 401. Also, the functional film 400 may be attached to the one side of the cover window 300 by using a roller or a bar. Then, the cover window 300, to which the functional film 400 is attached, may be combined with the display panel 200 by an adhesive (or an adhesive unit).

In some exemplary embodiments, the functional film 400 may include at least one functional layer.

Figure 4:
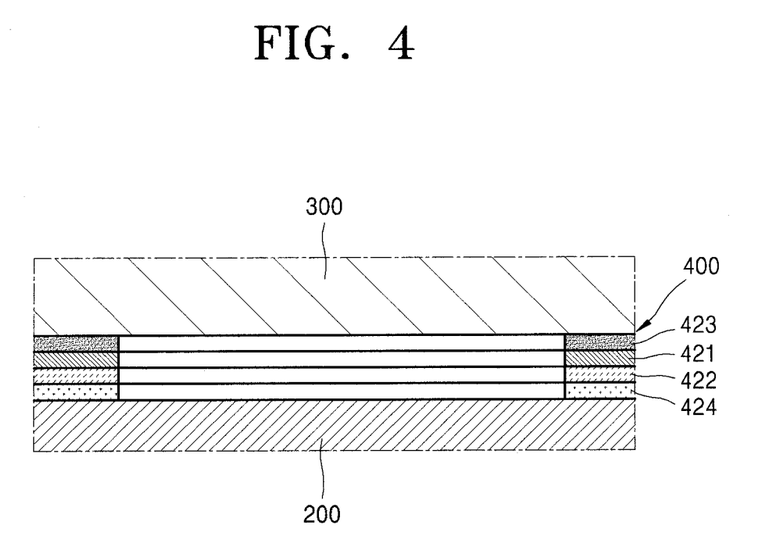
FIG. 4 is an enlarged cross-sectional view illustrating a portion of a functional film of the curved display device of FIG. 3.

FIG. 4 is an enlarged cross-sectional view illustrating a portion of the functional film 400 of the curved display device 100 of FIG. 3.

Referring to FIGS. 3 and 4, the functional film 400 may be disposed between the display panel 200 and the cover window 300.

The functional film 400 includes a substrate layer 421. The substrate layer 421 may be a film that maintains a shape of the functional film 400. The substrate layer 421 may include a material which is optically transparent and flexible. The substrate layer 421 may include one of polyethylene terephthalate (PET), polycarbonate (PC), polyimide (PI), polymethylmethacrylate (PMMA), polypropylene (PP), an acryl-based resin, and a silicone-based resin.

A first adhesive layer 423 may be interposed between the cover window 300 and the substrate layer 421. The first adhesive layer 423 may include at least one of an optical clear adhesive (OCA), an acryl adhesive, or a silicone adhesive.

A print layer 422 may be interposed between the display panel 200 and the substrate layer 421. The print layer 422 may have a pattern or a black matrix shape (e.g., may have a predetermined shape of a pattern or a black matrix). The print layer 422 may highlight a three dimensional appearance and/or block external light (e.g, an unnecessary external light).

The print layer 422 may be printed on (e.g., directly printed on) the substrate layer 421. Alternately, a print layer having a predetermined pattern may be printed on a film, and then the film with the print layer may be attached to the substrate layer 421. The print layer 422 may include an organic pigment and/or an inorganic pigment.

A second adhesive layer 424 may be further interposed between the display panel 200 and the print layer 422. The second adhesive layer 424 may be the same or substantially the same as the first adhesive layer 423.

In some exemplary embodiments, the functional film 400 may further include another functional layer, which provides another function to the curved display apparatus 100.

Figure 5:
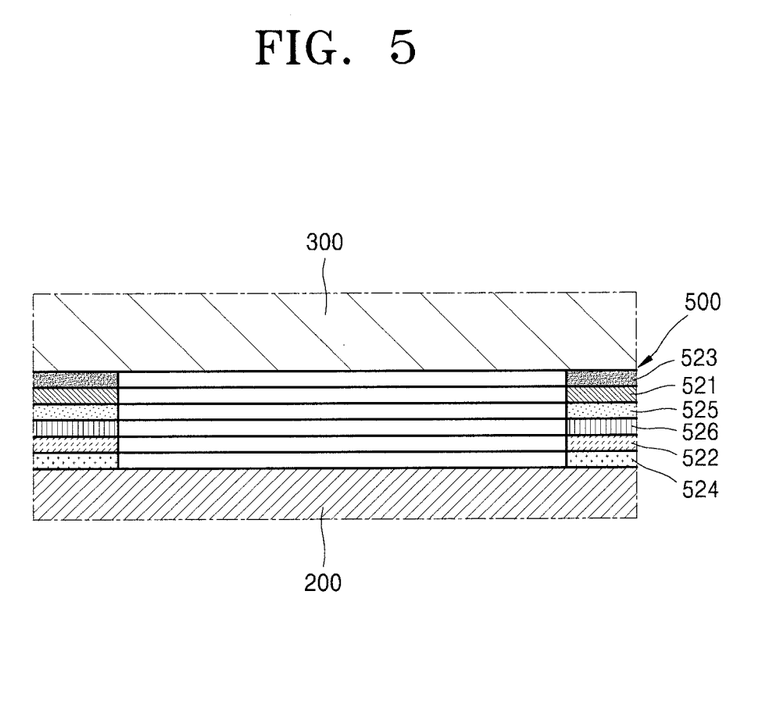
FIG. 5 is an enlarged cross-sectional view illustrating a portion of a function film according to one or more embodiments of the present inventive concept.

Referring to FIG. 5, a functional film 500 includes a substrate layer 521. The substrate layer 521 may be a base film that maintains a shape of the functional film 500. The substrate layer 521 may include an optically transparent polymer.

A first adhesive layer 523 may be interposed between the cover window 300 and the substrate layer 521. The first adhesive layer 523 may include an optical adhesive.

A print layer 522 may be interposed between the display panel 200 and the substrate layer 521. The print layer 522 may include an organic pigment and/or an inorganic pigment.

A second adhesive layer 524 may be further interposed between the display panel 200 and the print layer 522. The second adhesive layer 524 may be the same or substantially the same as the first adhesive layer 523.

A refractive layer 525 and an ultraviolet curing layer 526 may be further interposed between the substrate layer 521 and the print layer 522.

The refractive layer 525 has a refractive index that is the same or substantially same as a refractive index of the cover window 300. However, the present inventive concept is not limited thereto, and the refractive index of the refractive layer 525 may be variable. The refractive layer 525 may include titanium oxide ($TiO_2$) and/or silicon oxide ($SiO_2$).

The ultraviolet curing layer 526 may provide a visual appearance of metal texture.

Arrangement of the print layer 522, the refractive layer 525, and the ultraviolet curing layer 526 is not limited to one order, and the order of the print layer 522, the refractive layer 525, and the ultraviolet curing layer 526 may be suitably modified in other embodiments.

In some exemplary embodiments, an adhesive layer may be further provided between the adjacent ones of the print layer 522, the refractive layer 525, and the ultraviolet curing layer 526.

Figure 6:
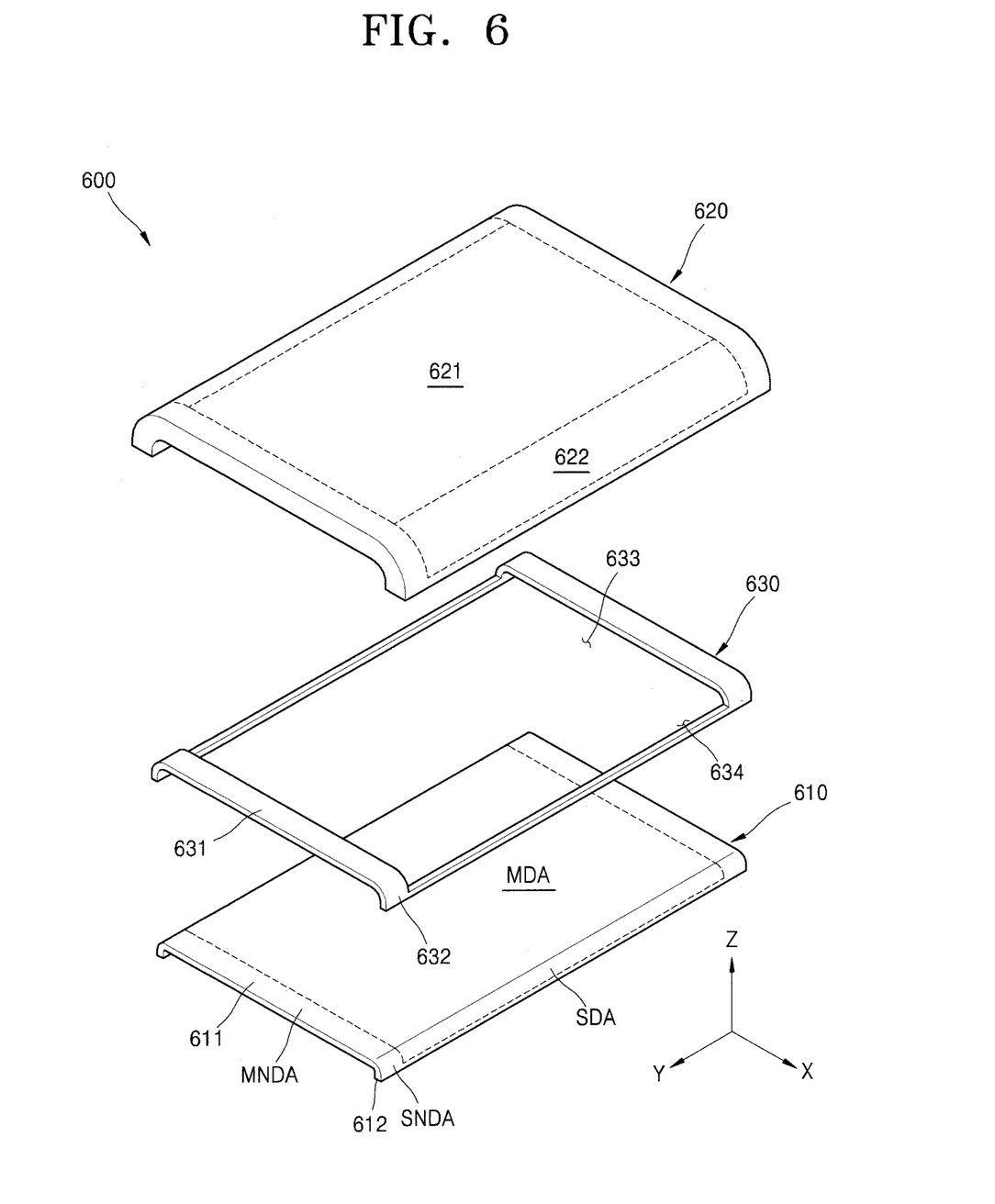
FIG. 6 is an exploded perspective view illustrating a curved display device according to one or more exemplary embodiments of the present inventive concept.

FIG. 6 is a cross-sectional view illustrating a display device 600 according to one or more exemplary embodiments of the present inventive concept.

Referring to FIG. 6, the display device 600 includes a display panel 610, a cover window 620 disposed on the display panel 610, and a functional film 630 disposed between the display panel 610 and the cover window 620.

The display panel 610 includes a flat portion 611 and a curved portion 612.

The flat portion 611 may include a first display area MDA, and the curved portion 612 may include a second display area SDA. The first display area MDA may be a main display area of the display apparatus 600, and the second display area SDA may be a sub-display area of the display apparatus 600.

A first non-display area MNDA may extend from an edge of the first display area MDA. The first non-display area MNDA may extend from at least the edge of the first display area MDA to an edge of the flat portion 611 of the display panel 610. A second non-display area SNDA may extend from one or more edges of the second display area SDA.

The second display area SDA may extend from the first display area MDA.

The first display area MDA and the second display area SDA may be continuously disposed from the flat portion 611 to the curved portion 612 without a boundary between the first display area MDA and the second display area SDA. The first display area MDA and the second display area SDA may provide a single screen or different screens. The first non-display area MNDA and the second non-display area SNDA may be connected to each other.

The cover window 620 includes a first region 621 having a substantially flat planar shape and a second region 622 that extends from the first region 301 and that includes at least one window curved surface. The second region 622 may be curved from the first region 621 in the third direction (or the Z direction).

The first region 621 may be disposed to correspond to the first display area MDA, and the second region 622 may be disposed to correspond to the second display area SDA. A size of the first region 621 may cover all of the first display area MDA and the first non-display area MNDA. A size of the second region 622 may correspond to the second display area SDA and the second non-display area SNDA.

The functional film 630 includes a first film portion 631 and a second film portion 632 that extends from the first film portion 631. The first film portion 631 may be disposed to correspond to the first region 621 of the cover window 620. The second film portion 632 may be disposed to correspond to the second region 622 of the cover window 620. The first film portion 631 and the second film portion 632 may be formed as one body (e.g., may be formed integrally).

The first film portion 631 may include a first opening 633. The first opening 633 may be disposed to correspond to the first display area MDA. The second film portion 632 may include a second opening 634. The second opening 634 may be disposed to correspond to the second display area SDA. The second opening 634 may extend from the first opening 633.

An entire size of the first opening 633 and the second opening 634 may be the same or substantially the same as an entire size of the first display area MDA and the second display area SDA. An integrated body of the first film portion 631 and the second film portion 632 may surround (e.g., entirely surround) the first opening 633 and the second opening 634.

If the functional film 630 has a structure which does not have a film at an area corresponding to the first display area MDA and the second display area SDA, the present inventive concept is not limited to a specific shape of the functional film 630. For example, the first film portion 631 having the first opening 633 may be attached to an area of the first non-display area MNDA in the flat portion 611. The second film portion 632 having the second opening 634 may be attached to an area of the second non-display area SNDA in the curved portion 612. In some exemplary embodiments, the first film portion 631 and the second film portion 632 may be separable from each other.

Figure 8:
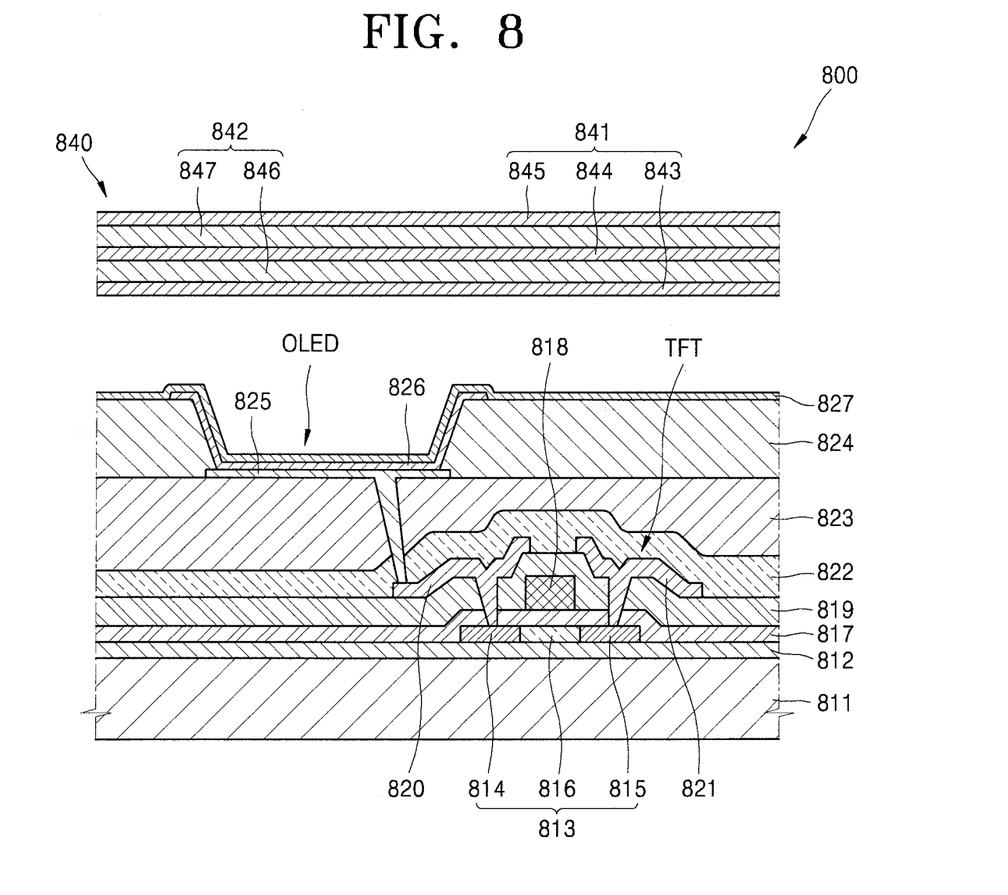
FIG. 8 is a cross-sectional view illustrating a sub-pixel of an organic light-emitting display device according to one or more embodiments of the present inventive concept.

FIG. 8 is a cross-sectional view illustrating a sub-pixel of a display panel 800 according to one or more exemplary embodiments of the present inventive concept.

In the present exemplary embodiment, an organic light-emitting display device (OLED) is illustrated as an example of a display device of the display panel 800. However, the present inventive concept is not limited thereto. For example, the display panel 800 may include a liquid crystal display device (LCD), a field emission display device (FED), and/or an electronic paper display device (ED).

In the present exemplary embodiment, sub-pixels may each include at least one thin film transistor and an organic light-emitting device (OLED). The thin film transistor is not limited to a structure illustrated in FIG. 8. The number of thin film transistors and a structure of each thin film transistor may be suitably modified.

Referring to FIG. 8, the display panel 800 includes a display substrate 811 and a thin film encapsulation (TFE) layer 840 disposed on the display substrate 811.

The display substrate 811 may be a flexible glass substrate and/or a flexible polymer substrate. The display substrate 811 may be transparent, semitransparent, or translucent.

A buffer film 812 may be formed on the display substrate 811. The buffer film 812 may cover an entire upper surface of the display substrate 811. The buffer film 812 may include an inorganic compound and/or an organic compound. The buffer film 812 may have a single layer or a multilayer structure.

A thin film transistor TFT may be formed on the buffer film 812. In some exemplary embodiments, the thin film transistor TFT may be referred to as a top gate transistor. However, the thin film transistor TFT may be a different type of a transistor, such as a bottom gate transistor.

A semiconductor active layer 813 may be formed on the buffer layer 812.

The semiconductor active layer 813 includes a source area 814 and a drain area 815 which are formed by doping the semiconductor active layer 813 with N-type ion impurities or P-type ion impurities. A channel area 816 is disposed between the source area 814 and the drain area 815 without being doped with impurities. The semiconductor active layer 813 may include an organic semiconductor, an inorganic semiconductor, and/or amorphous silicon. In some exemplary embodiments, the semiconductor active layer 813 may include an oxide semiconductor.

A gate insulation film 817 may be formed on the semiconductor active layer 813. The gate insulation film 817 may include an inorganic film. The gate insulation film 817 may have a single layer or a multilayer structure.

A gate electrode 818 may be formed on the gate insulation film 817. The gate electrode 818 may include a metal having conductivity (e.g., having excellent conductivity). The gate electrode 818 may have a single layer or a multilayer structure.

An interlayer insulation film 819 may be formed on the gate electrode 818. The interlayer insulation film 819 may have a single layer or a multilayer structure.

A source electrode 820 and a drain electrode 821 may be formed on the interlayer insulation film 819. In more detail, contact openings (e.g., contact holes) are formed in portions of the gate insulation film 817 and the interlayer insulation film 819, the source electrode 820 is electrically connected to the source area 814 through one of the contact openings, and the drain electrode 821 is electrically connected to the drain area 815 through one of the contact openings.

A passivation film 822 may be formed on the source electrode 820 and the drain electrode 821. The passivation film 822 may include an organic film and/or an inorganic film. A planarization film 823 may be formed on the passivation film 822. The planarization film 823 may include an organic film. In one or more exemplary embodiments, one of the passivation film 822 and the planarization film 823 may be omitted.

The thin film transistor TFT may be electrically connected to an organic light-emitting display device OLED.

The organic light-emitting display device OLED may be formed on the planarization film 823. The organic light-emitting display device OLED includes a first electrode 825, an intermediate layer 826, and a second electrode 827.

The first electrode 825 functions as an anode and may include various suitable conductive materials. The first electrode 825 may include a transparent electrode or a reflective electrode. For example, when the first electrode 825 is utilized as the transparent electrode, the first electrode 825 includes a transparent conductive film. When the first electrode 825 is utilized as the reflective electrode, the first electrode 825 includes a reflective film and a transparent conductive film formed on the reflective film.

A pixel defining film 824 may be formed on the planarization film 823. The pixel defining film 824 may cover a portion of the first electrode 825. In more detail, the pixel defining film 824 may define a light-emitting area of each sub-pixel by surrounding an edge of the first electrode 825. The first electrode 825 may be patterned in each sub-pixel.

The pixel defining film 824 may include an organic film and/or an inorganic film. The pixel defining film 824 may have a single layer or a multilayer structure.

The intermediate layer 826 may be formed at (or on) an area of the first electrode 825 which is exposed by etching a portion of the pixel defining film 824. The intermediate layer 826 may be formed by an evaporation method, for example.

The intermediate layer 826 may include an organic emissive layer. In some exemplary embodiments, the intermediate layer 826 may include the organic emissive layer and may further include at least one of a hole injection layer (HIL), a hole transport layer (HTL), an electron transport layer (ETL), and an electron injection layer (EIL). However, the present inventive concept is not limited thereto and the intermediate layer 826 may include various functional layers in addition to the organic emissive layer.

The second electrode 827 may be formed on the intermediate layer 826.

The second electrode 827 may function as a cathode. The second electrode 827 may include a transparent electrode or a reflective electrode. For example, when the second electrode 827 is utilized as the transparent electrode, the second electrode 827 includes a metal film and a transparent conductive film formed on the metal film. When the second electrode 827 is utilized as the reflective electrode, the second electrode 827 includes a metal film.

In some exemplary embodiments, a plurality of sub-pixels may be formed on the display substrate 811, and the respective sub-pixels may generate red, green, blue or white colors. However, the present inventive concept is not limited thereto.

The thin film encapsulation layer 840 may cover the organic light-emitting display device OLED. The thin film encapsulation layer 840 may include an inorganic film 841 and an organic film 842, which are alternately laminated (or stacked). For example, the inorganic film 841 includes a first inorganic film 843, a second inorganic film 844, and a third inorganic film 845. The organic film 842 includes a first organic film 846 and a second organic film 847.

As described above, the curved display apparatus according to one or more exemplary embodiments of the present inventive concept may omit a functional film in a display area thereof. Accordingly, foreign materials, which may be attached to the functional film, and scratches, which may typically occur on the functional film, may be prevented from occurring on the curved display apparatus, and a clear image may be provided in (or by) the curved display apparatus.

It is to be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A curved display apparatus comprising:
a display panel having a curvature and comprising:
a display area; and
a non-display area extending from at least one side of the display area;
a cover window on the display panel, the cover window having a curvature and comprising:
a first region; and
a second region extending from at least one side of the first region; and
a functional film between the display panel and the cover window, the functional film comprising:
a first film portion corresponding to the first region;
a second film portion corresponding to the second region; and
an opening exposing the display area of the display panel.

2. The curved display apparatus of claim 1, wherein:
the display area corresponds to the first region; and
the opening corresponds to the display area.

3. The curved display apparatus of claim 2, wherein the first region has a substantially planar shape.

4. The curved display apparatus of claim 3, wherein the first film portion surrounds the opening.

5. The curved display apparatus of claim 2, wherein the first film portion and the second film portion are integrally formed.

6. The curved display apparatus of claim 2, wherein the second region is curved from the first region.

7. The curved display apparatus of claim 2, wherein a size of the opening is the same as a size of the display area.

8. The curved display apparatus of claim 2, wherein the display area comprises:
a first display area corresponding to the first region; and
a second display area extending from at least one side of the first display area, and corresponding to the second region.

9. The curved display apparatus of claim 8, wherein the first display area and the second display area are continuous with each other and located on the display panel.

10. The curved display apparatus of claim 8, wherein the opening defines a first opening corresponding to the first display area, and a second opening corresponding to the second display area.

11. The curved display apparatus of claim 10, wherein the first opening and the second opening are continuous.

12. The curved display apparatus of claim 10, wherein the first film portion and the second film portion are integrally formed and entirely surround the first opening and the second opening.

13. The curved display apparatus of claim 1, wherein the functional film comprises:
a substrate layer; and
a print layer between the substrate layer and the display panel.

14. The curved display apparatus of claim 13, wherein the substrate layer comprises at least one of polyethylene terephthalate (PET), polycarbonate (PC), polyimide (PI), polymethylmethacrylate (PMMA), polypropylene (PP), an acryl-based resin, and a silicone-based resin.

15. The curved display apparatus of claim 13, wherein the print layer comprises at least one of an organic pigment and an inorganic pigment.

16. The curved display apparatus of claim 13, wherein the functional film comprises a first adhesive layer between the substrate layer and the cover window.

17. The curved display apparatus of claim 16, wherein the first adhesive layer comprises at least one of an optical adhesive, an acryl adhesive, and a silicone adhesive.

18. The curved display apparatus of clam 13, wherein the functional film comprises a refractive layer.

19. The curved display apparatus of claim 13, wherein the functional film comprises an ultraviolet curing layer.

20. The curved display apparatus of claim 13, wherein the display panel comprises:
a display substrate;
an organic light-emitting device on the display substrate and comprising:
a first electrode;
a second electrode; and
an organic emissive layer between the first electrode and the second electrode; and
a thin film encapsulation film on the organic light-emitting device.

* * * * *